United States Patent

Nomura et al.

(10) Patent No.: US 9,473,131 B2
(45) Date of Patent: Oct. 18, 2016

(54) SIGNAL OUTPUT CIRCUIT, ELECTRONIC DEVICE AND MOVING OBJECT

(71) Applicant: Seiko Epson Corporation, Tokyo (JP)

(72) Inventors: Masataka Nomura, Minowa (JP); Akira Nakada, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/804,570

(22) Filed: Jul. 21, 2015

(65) Prior Publication Data

US 2016/0028389 A1   Jan. 28, 2016

(30) Foreign Application Priority Data

Jul. 23, 2014  (JP) .................. 2014-149631

(51) Int. Cl.
  *H03K 3/017* (2006.01)
  *H03K 7/08* (2006.01)

(52) U.S. Cl.
  CPC ....................... *H03K 7/08* (2013.01)

(58) Field of Classification Search
  None
  See application file for complete search history.

(56) References Cited

U.S. PATENT DOCUMENTS

| | | | |
|---|---|---|---|
| 5,341,111 A | 8/1994 | Miya et al. | |
| 6,188,733 B1 * | 2/2001 | Kawai | H04L 27/14 |
| | | | 329/300 |
| 6,329,980 B1 * | 12/2001 | Uehara | G09G 3/20 |
| | | | 208/87 |
| 8,305,123 B2 | 11/2012 | Kikuchi | |
| 2016/0028384 A1 * | 1/2016 | Nomura | H03K 5/00006 |
| | | | 327/116 |

FOREIGN PATENT DOCUMENTS

| | | |
|---|---|---|
| JP | 05-102728 A | 4/1993 |
| JP | 07-176953 A | 7/1995 |
| JP | 2000-323929 A | 11/2000 |
| JP | 2001-144543 A | 5/2001 |
| JP | 2005-286706 A | 10/2005 |
| JP | 2007-158803 A | 6/2007 |
| JP | 2010-127632 A | 6/2010 |

* cited by examiner

*Primary Examiner* — Cassandra Cox

(74) *Attorney, Agent, or Firm* — Harness, Dickey & Pierce, P.L.C.

(57) ABSTRACT

A signal output circuit includes a signal correction circuit, having a clock signal input thereto, which corrects the clock signal to output the corrected signal, and a waveform shaping circuit that shapes a signal from the signal correction circuit. In the clock signal, pulses having a pulse width $\tau$ capable of being represented by a length of a time are periodically arranged with a period T, and the pulse width $\tau$ and the period T satisfy a relation of $\tau/T \neq 0.5$. The signal correction circuit attenuates a signal having a second frequency based on a time width of at least one of the pulse width $\tau$ and a pulse width $T-\tau$, rather than a signal having a first frequency based on the period T.

13 Claims, 6 Drawing Sheets

SIGNAL OUTPUT CIRCUIT, ELECTRONIC DEVICE AND MOVING OBJECT

BACKGROUND

1. Technical Field

The present invention relates to a signal output circuit, an electronic device and a moving object.

2. Related Art

A clock signal generated from an oscillation signal which is output by an oscillation circuit is used in various products. In addition, high accuracy is required for the duty ratio of a clock signal depending on an application.

JP-A-2010-127632 discloses a duty correction circuit including a duty detection circuit, a duty adjustment signal generating circuit and a duty adjustment circuit, in order to improve the duty ratio of a clock signal.

JP-A-5-102728 discloses a multiplier including a bandpass filter that removes a frequency component of a fundamental mode and extracts a multiplied frequency to output the extracted frequency, at the output terminal side.

Since the duty correction circuit disclosed in JP-A-2010-127632 requires a configuration in which a duty ratio is detected by the duty detection circuit, and an adjustment signal is generated by the duty adjustment signal generating circuit to feedback the generated signal to the duty adjustment circuit, there is a concern that the configuration may be complicated. In addition, the multiplier disclosed in JP-A-5-102728 is not likely to improve the duty ratio of an output signal.

SUMMARY

An advantage of some aspects of the invention is to provide a signal output circuit, an electronic device and a moving object which are capable of improving a duty ratio with a simple configuration.

The invention can be implemented as the following forms or application examples.

Application Example 1

This application example is directed to a signal output circuit including: a signal correction circuit, having a clock signal input thereto, which corrects the clock signal to output the corrected signal; and a waveform shaping circuit that shapes a signal from the signal correction circuit, wherein in the clock signal, pulses having a pulse width $\tau$ capable of being represented by a length of a time are periodically arranged with a period T, and the pulse width $\tau$ and the period T satisfy a relation of $\tau/T \neq 0.5$, and the signal correction circuit attenuates a signal having a second frequency based on a time width of at least one of the pulse width $\tau$ and a pulse width $T-\tau$, rather than a signal having a first frequency based on the period T.

The signal having a first frequency based on the period T is a signal in which $1/T$ is used as a first frequency. The signal having a second frequency based on the time width of the pulse width $\tau$ is a signal in which $1/(2 \times \tau)$ is used as a second frequency. The signal having a second frequency based on the time width of $T-\tau$ is a signal in which $1/(2 \times (T-\tau))$ is used as a second frequency.

According to this application example, a component having a second frequency which is an unnecessary frequency component is attenuated. Therefore, when a clock signal is input in which a duty ratio having a relation of $\tau/T \neq 0.5$ shifts from an ideal value (0.5), it is possible to obtain an output signal (clock signal) having a first frequency which has an improvement in duty ratio. Therefore, it is possible to realize a signal output circuit capable of improving a duty ratio with a simple configuration.

Application Example 2

In the application example described above, the signal correction circuit may include a filter circuit that passes the signal having a first frequency and attenuates the signal having a second frequency.

According to this application example, since the filter circuit that passes the signal having a first frequency and attenuates the signal having a second frequency is included, it is possible to obtain an output signal having a first frequency which has an improvement in duty ratio. Therefore, it is possible to realize a signal output circuit capable of improving a duty ratio with a simple configuration.

Application Example 3

In the application example described above, the signal correction circuit may include a series circuit, connected between a signal line through which the clock signal is transmitted and a reference potential, which has an inductor and a first capacitance circuit connected in series to each other.

According to this application example, since the signal having a second frequency can be attenuated, for example, by the series resonance frequency of the series circuit being set to a second frequency, it is possible to obtain an output signal having a first frequency which has an improvement in duty ratio. Therefore, it is possible to realize a signal output circuit capable of improving a duty ratio with a simple configuration.

Application Example 4

In the application example described above, the first capacitance circuit may include a variable capacitive element.

According to this application example, since a frequency capable of being attenuated can be adjusted, it is possible to change the frequency characteristics of the signal correction circuit, for example, in accordance with a shift in the duty ratio of the clock signal. Therefore, it is possible to realize a signal output circuit capable of improving a duty ratio with a simple configuration.

Application Example 5

In the application example described above, a first correction signal generation circuit that generates a first control signal based on at least one of the pulse width $\tau$ and the period T may be further included, and a capacitance value of the first capacitance circuit may be controlled on the basis of the first control signal.

According to this application example, it is possible to change the frequency characteristics of the signal correction circuit in accordance with a shift in the duty ratio of the clock signal. Therefore, it is possible to realize a signal output circuit capable of improving a duty ratio with a simple configuration.

Application Example 6

In the application example described above, the signal correction circuit may further include a second capacitance circuit which is connected in parallel to the series circuit.

According to this application example, since the signal having a first frequency can be passed, for example, by the parallel resonance frequencies of the inductor of the series circuit and the second capacitance circuit being set to a first frequency, it is possible to obtain an output signal having a first frequency which has an improvement in duty ratio. Therefore, it is possible to realize a signal output circuit capable of improving a duty ratio with a simple configuration.

Application Example 7

In the application example described above, the second capacitance circuit may include a variable capacitive element.

According to this application example, since a frequency capable of being passed can be adjusted, it is possible to change the frequency characteristics of the signal correction circuit, for example, in accordance with the frequency of the clock signal. Therefore, it is possible to realize a signal output circuit capable of improving a duty ratio with a simple configuration.

Application Example 8

In the application example described above, a second correction signal generation circuit that generates a second control signal based on the pulse width $\tau$ may be further included, and a capacitance value of the second capacitance circuit may be controlled on the basis of the second control signal.

According to this application example, it is possible to change the frequency characteristics of the signal correction circuit in accordance with the frequency of the clock signal. Therefore, it is possible to realize a signal output circuit capable of improving a duty ratio with a simple configuration.

Application Example 9

This application example is directed to an electronic device including any of the signal output circuits described above.

Application Example 10

This application example is directed to a moving object including any of the signal output circuits described above.

According to the electronic device and the moving object, since the signal output circuit capable of improving a duty ratio with a simple configuration is included, it is possible to improve the accuracy of the clock signal with a simple configuration. Therefore, it is possible to realize an electronic device and a moving object having high reliability using a clock signal with good accuracy, or an electronic device and a moving object which can operate accurately.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. The drawings used herein are for convenience of description. Meanwhile, the embodiments described below are not unduly limited to the disclosure of the invention described in the appended claims. In addition, all the configurations described below are not necessarily essential components of the invention.

1. Signal Output Circuit 1-1. First Embodiment

Figure 1:
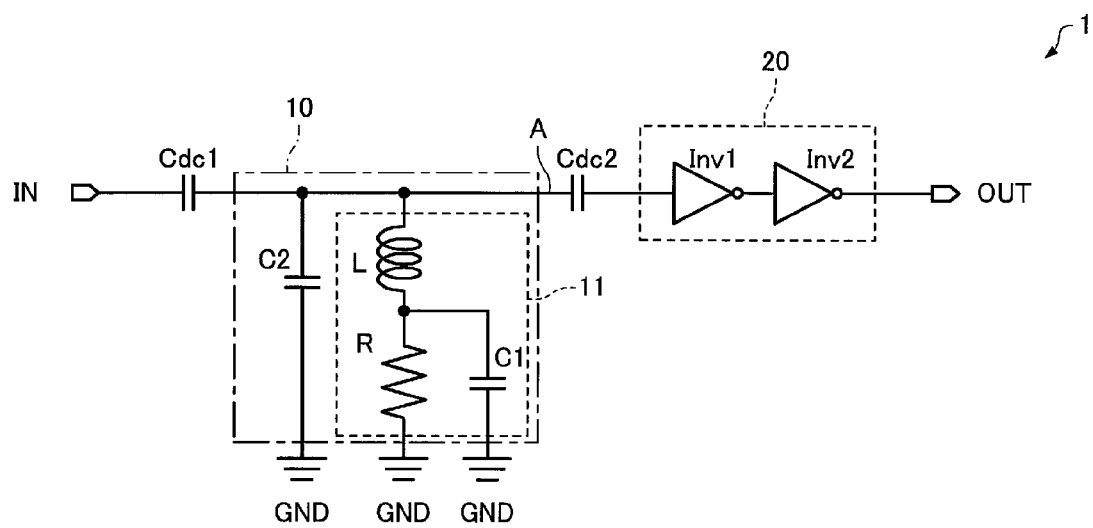
FIG. 1 is a circuit diagram of a signal output circuit according to a first embodiment.

FIG. 1 is a circuit diagram of a signal output circuit 1 according to a first embodiment.

The signal output circuit 1 according to the present embodiment includes a signal correction circuit 10 and a waveform shaping circuit 20.

The signal correction circuit 10 has a clock signal input thereto, and corrects a clock signal to output the corrected signal. In an example shown in FIG. 1, a clock signal which is input from an input terminal IN is input to the signal correction circuit 10 through a capacitive element Cdc1. The signal correction circuit 10 outputs the corrected signal to the waveform shaping circuit 20 through a capacitive element Cdc2. The capacitive element Cdc1 and the capacitive element Cdc2 function as DC-cut capacitors that remove a direct-current component.

In the example shown in FIG. 1, the signal correction circuit 10 includes a series circuit 11 having an inductor L and a first capacitance circuit C1 connected in series to each other which is connected between a signal line through which a clock signal is transmitted and a reference potential. The series circuit 11 is a serial resonance circuit having a series resonance frequency. In addition, the series circuit 11 further includes a resistor R which is connected in parallel to the first capacitance circuit C1. The reference potential in the present embodiment is a ground potential GND. Meanwhile, the first capacitance circuit C1 may be constituted by one or more electrostatic capacitive elements having a constant capacitance value or one or more variable capacitive elements having a variable capacitance, and may be configured by combining these elements.

In the example shown in FIG. 1, the signal correction circuit 10 further includes a second capacitance circuit C2 which is connected in parallel to the series circuit 11. The inductor L of the series circuit 11 and the second capacitance circuit C2 constitute a parallel resonance circuit having a parallel resonance frequency. Meanwhile, the second capacitance circuit C2 may be constituted by one or more electrostatic capacitive elements having a constant capacitance value or one or more variable capacitive elements having a variable capacitance, and may be configured by combining these elements.

The waveform shaping circuit 20 shapes a signal from the signal correction circuit 10 into a square wave. In the example shown in FIG. 1, the waveform shaping circuit 20 includes an inverter Inv1 and an inverter Inv2 which are connected in series to each other. An output signal of the signal correction circuit 10 is input to the waveform shaping circuit 20 through the capacitive element Cdc2, and the shaped signal is output to an output terminal OUT.

Figure 2:
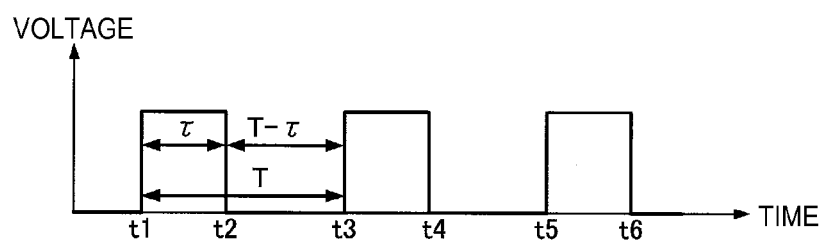
FIG. 2 is a graph schematically illustrating an example of a clock signal.

FIG. 2 is a graph schematically illustrating an example of a clock signal. The horizontal axis of FIG. 2 represents a time, and the vertical axis represents a voltage.

In the clock signal, pulses having a pulse width $\tau$ (on the time axis) which are capable of being represented by the length of a time are periodically arranged with a period T. In an example shown in FIG. 2, for example, a time from time t1 which is a signal rising timing to time t3 which is the next rising timing is one period. The pulse width $\tau$ is a length of a period in which a high-level voltage is set. In the example shown in FIG. 2, for example, a time from time t1 which is a signal rising timing to time t2 which is the next falling timing is the pulse width $\tau$. A duty ratio D1 of the clock signal is a proportion of the pulse width $\tau$ per period, and is represented by the following expression.

$$D1=\tau/T$$

The signal correction circuit 10 attenuates a signal having a second frequency based on the time width of at least one of pulse widths $\tau$ and T-$\tau$, rather than a signal having a first frequency based on the period T. The frequency characteristics (transmission characteristics) of the signal correction circuit 10 may be passband characteristics or band removal characteristics. In addition, the duty ratio D1 of the input clock signal is D1≠0.5.

The signal having a first frequency based on the period T is a signal in which 1/T is used as a first frequency. The signal having a second frequency based on the time width of the pulse width $\tau$ is a signal in which 1/(2×$\tau$) is used as a second frequency. The signal having a second frequency based on the time width of T-$\tau$ is a signal in which 1/(2×(T-$\tau$)) is used as a second frequency.

Figure 3:
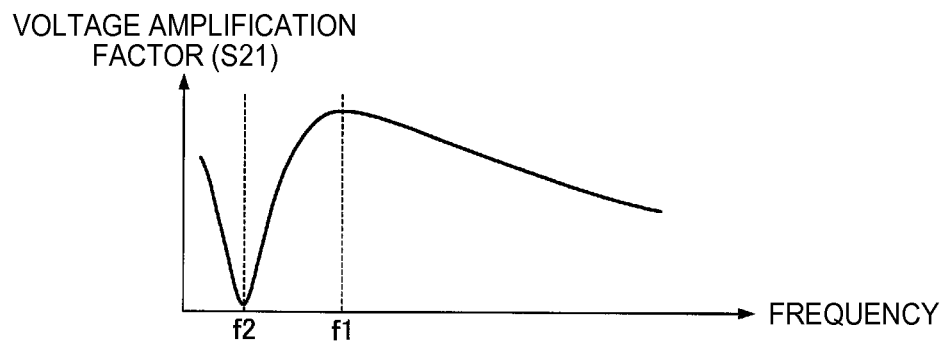
FIG. 3 is a graph illustrating the transmission characteristics of a signal correction circuit.

FIG. 3 is a graph illustrating the transmission characteristics of the signal correction circuit 10. The horizontal axis of FIG. 3 represents a frequency, and the vertical axis represents a voltage amplification factor (S21). In an example shown in FIG. 3, the voltage amplification factor of the signal correction circuit 10 has a maximum value at a frequency f1, and has a minimum value at a frequency f2. The frequency f1 is a frequency equivalent to the parallel resonance frequency of the parallel resonance circuit having the inductor L of the series circuit 11 and the second capacitance circuit C2 connected in parallel to each other. The frequency f2 is a frequency equivalent to the series resonance frequency of the series circuit 11.

In the present embodiment, the frequency f1 is set to a first frequency equivalent to 1/T, and the frequency f2 is set to a second frequency equivalent to 1/(2×(T-$\tau$)). That is, an example in which the second frequency f2 is lower than the first frequency f1 is shown.

Figure 4:
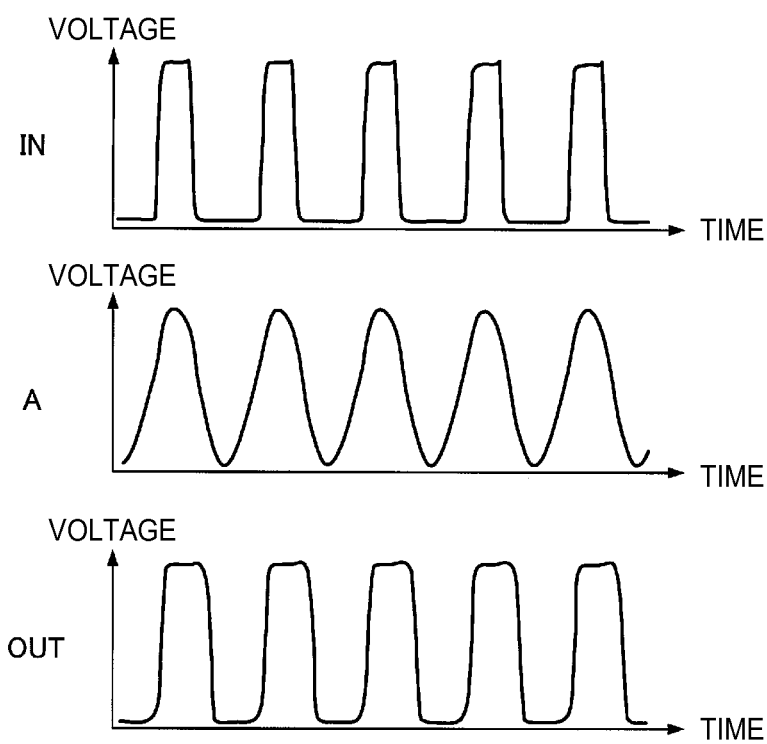
FIG. 4 is a graph illustrating waveform examples according to the first embodiment.

FIG. 4 is a graph illustrating waveform examples in the present embodiment. In order from above in FIG. 4, a waveform at the input terminal IN, a waveform at a node A which is an output node of the signal correction circuit 10, and a waveform at the output terminal OUT are represented. In each graph of FIG. 4, the horizontal axis represents a time, and the vertical axis represents a voltage.

In an example shown in FIG. 4, a clock signal having a duty ratio smaller than 0.5 is input to the input terminal IN. That is, T-$\tau$ which is a value obtained by subtracting the pulse width $\tau$ from the period T has a relation of T-$\tau$>0.5×T, and thus a second frequency 1/(2×(T-$\tau$)) becomes lower than a first frequency 1/T. At the node A, a component having a second frequency is attenuated, and a signal close to a sinusoidal wave having a first frequency appears. The waveform shaping circuit 20 shapes the signal of the node A, and thus a waveform having a duty ratio closer to 0.5 than the waveform at the input terminal IN appears in the output terminal OUT. Meanwhile, in the above example, the second frequency f2 is set to a frequency lower than the first frequency f1. However, even when the second frequency f2 is set to a frequency higher than the first frequency f1 without being limited thereto, it is possible to obtain a similar effect by attenuating the component having a second frequency, for example, using the second frequency as 1/(2×$\tau$).

According to the present embodiment, since the component having a second frequency which is an unnecessary frequency component is attenuated, it is possible to obtain an output signal having a first frequency which has an improvement in duty ratio. Therefore, it is possible to realize the signal output circuit 1 capable of improving a duty ratio with a simple configuration. Meanwhile, when a clock signal having a duty ratio larger than 0.5 is input, the setting of the frequency f2 to the second frequency equivalent to 1/(2×$\tau$) makes it possible to obtain a similar effect.

According to the present embodiment, since the signal having a second frequency can be attenuated, for example, by the series resonance frequency of the series circuit 11 being set to the second frequency, it is possible to obtain the output signal having a first frequency which has an improvement in duty ratio. Therefore, it is possible to realize the signal output circuit 1 capable of improving a duty ratio with a simple configuration.

According to the present embodiment, since the signal having a first frequency can be passed, for example, by the parallel resonance frequencies of the inductor L of the series circuit 11 and the second capacitance circuit C2 being set to the first frequency, it is possible to obtain the output signal having a first frequency which has an improvement in duty ratio. Therefore, it is possible to realize the signal output circuit 1 capable of improving a duty ratio with a simple configuration.

1-2. Second Embodiment

Figure 5:
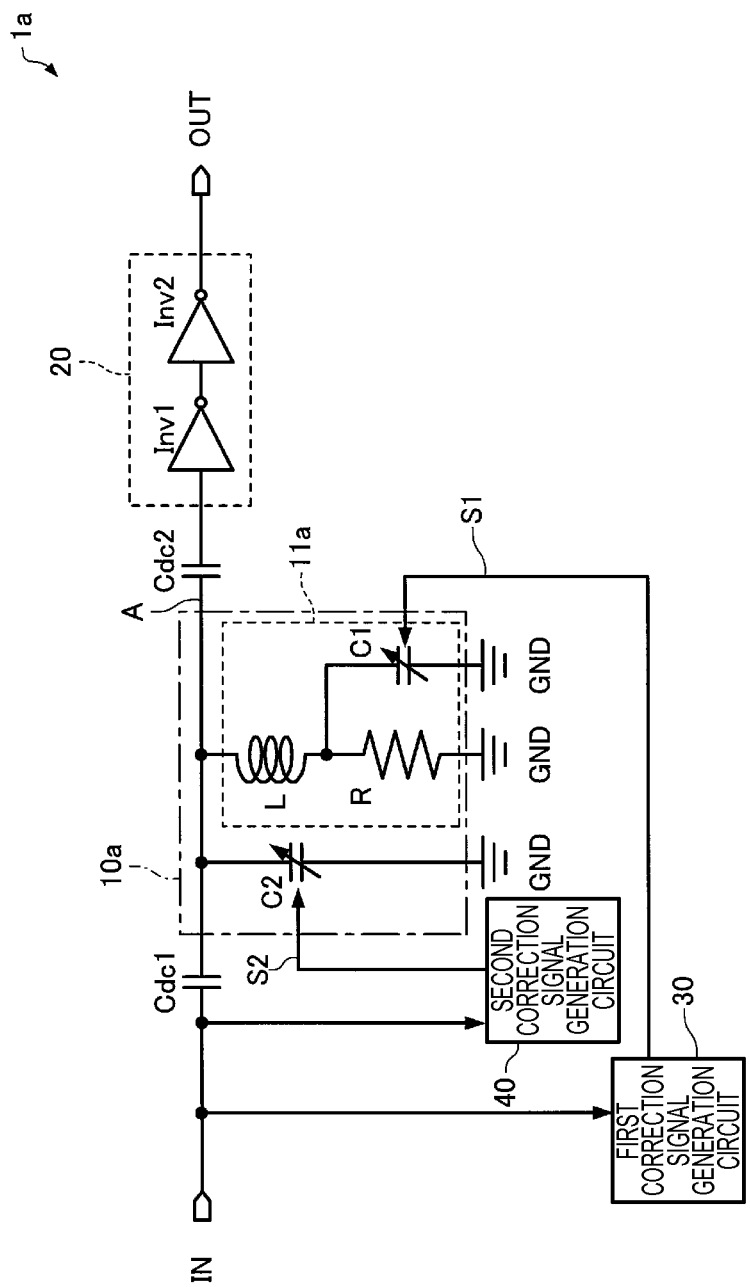
FIG. 5 is a circuit diagram of a signal output circuit according to a second embodiment.

FIG. 5 is a circuit diagram of a signal output circuit 1a according to a second embodiment. The same components as those shown in FIG. 1 are denoted by the same reference numerals and signs, and thus the detailed description thereof will not be given.

The signal output circuit 1a according to the present embodiment includes a signal correction circuit 10a, a first correction signal generation circuit 30, and a second correction signal generation circuit 40. The signal correction circuit 10a includes a series circuit 11a.

A first capacitance circuit C1 of the signal output circuit 1a according to the present embodiment is constituted by a variable capacitance circuit having a variable capacitance value. In an example shown in FIG. 5, the first capacitance circuit C1 is configured to include a variable capacitive element. The first capacitance circuit C1 may be constituted by a capacitor array circuit having a variable capacitance value.

According to the present embodiment, since a frequency (second frequency) capable of being attenuated can be adjusted, it is possible to change the frequency characteristics (transmission characteristics) of the signal correction circuit 10a, for example, in accordance with a shift in the duty ratio of the clock signal. That is, even when the duty ratio of the input clock signal changes, it is possible to easily adjust a frequency capable of being attenuated, for example, to a frequency (second frequency) based on the period T and the pulse width τ. Therefore, it is possible to realize the signal output circuit 1a capable of improving a duty ratio with a simple configuration.

A second capacitance circuit C2 of the signal output circuit 1a according to the present embodiment is constituted by a variable capacitance circuit having a variable capacitance value. In the example shown in FIG. 5, the second capacitance circuit C2 is configured to include a variable capacitive element. The second capacitance circuit C2 may be constituted by a capacitor array circuit having a variable capacitance value.

According to the present embodiment, since a frequency capable of being passed (first frequency) can be adjusted, it is possible to change the frequency characteristics (transmission characteristics) of the signal correction circuit 10a, for example, in accordance with the frequency of the clock signal. That is, even when the frequency of the input clock signal changes, it is possible to easily adjust the frequency capable of being passed, for example, to the frequency (first frequency) based on the period T. Therefore, it is possible to realize the signal output circuit 1a capable of improving a duty ratio with a simple configuration.

The first correction signal generation circuit 30 generates a first control signal S1 based on at least one of the pulse width τ and the period T. The capacitance value of the first capacitance circuit C1 is controlled on the basis of the first control signal S1.

In the example shown in FIG. 5, a clock signal from an input terminal IN is input to the first correction signal generation circuit 30, and the first control signal S1 is output to the control terminal of the first capacitance circuit C1 so that the series resonance frequency of the series circuit 11 becomes close to a frequency based on a time width of at least one of the pulse widths τ and T–τ.

According to the present embodiment, it is possible to change the frequency characteristics (transmission characteristics) of the signal correction circuit 10a in accordance with a shift in the duty ratio of the clock signal. That is, even when the duty ratio of the input clock signal changes, it is possible to easily adjust the frequency capable of being attenuated, for example, to the frequency (second frequency) based on the period T and the pulse width τ. Therefore, it is possible to realize the signal output circuit 1a capable of improving a duty ratio with a simple configuration.

The second correction signal generation circuit 40 generates a second control signal S2 based on the period T. The capacitance value of the second capacitance circuit C2 is controlled on the basis of the second control signal S2.

In the example shown in FIG. 5, the clock signal from the input terminal IN is input to the second correction signal generation circuit 40, and the second control signal S2 is output to the control terminal of the second capacitance circuit C2 so that the parallel resonance frequency of the parallel resonance circuit constituted by the inductor L of the series circuit 11 and the second capacitance circuit C2 becomes close to a frequency based on the time width of the period T.

According to the present embodiment, it is possible to change the frequency characteristics of the signal correction circuit 10a in accordance with the frequency of the clock signal. That is, even when the frequency of the input clock signal changes, it is possible to easily adjust the frequency capable of being passed, for example, to the frequency (first frequency) based on the period T. Therefore, it is possible to realize the signal output circuit 1a capable of improving a duty ratio with a simple configuration.

In addition, in the second embodiment, it is also possible to exhibit the same effect as that in the first embodiment for the same reason.

1-3. Third Embodiment

Figure 6:
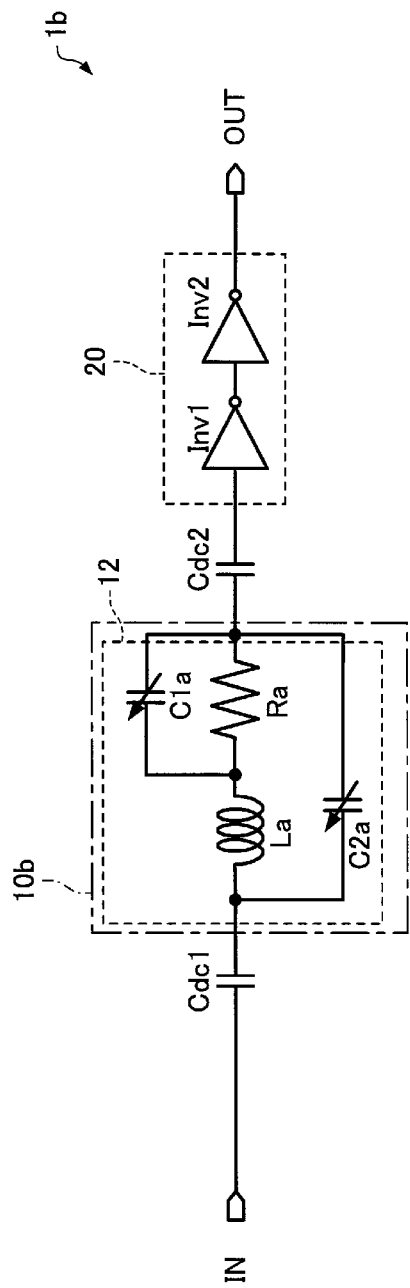
FIG. 6 is a circuit diagram of a signal output circuit according to a third embodiment.

FIG. 6 is a circuit diagram of a signal output circuit 1b according to a third embodiment. The same components as those shown in FIG. 1 are denoted by the same reference numerals and signs, and thus the detailed description thereof will not be given.

The signal output circuit 1b according to the present embodiment includes a signal correction circuit 10b. The signal correction circuit 10b includes a filter circuit 12 that passes a signal having a first frequency and attenuates a signal having a second frequency. The frequency characteristics (transmission characteristics) of the filter circuit 12 may be passband characteristics or band removal characteristics. Meanwhile, the filter circuit 12 is not limited to the above-mentioned configuration, and, for example, a SAW filter using a SAW resonator, a transversal-type SAW filter, a quartz crystal filter using a quartz crystal resonator, a ceramic filter using a ceramic resonator, a MEMS filter using a MEMS (Micro Electro Mechanical Systems) resonator, or the like may be used.

In an example shown in FIG. 6, the filter circuit 12 includes a serial resonance circuit constituted by an inductor La and a first capacitance circuit C1a which is connected into a signal path through which a clock signal is transmitted. The inductor La and the first capacitance circuit C1a constitute a serial resonance circuit having a series resonance frequency. In addition, the filter circuit 12 further includes a resistor Ra which is connected in parallel to the first capacitance circuit C1a. In addition, the filter circuit 12 further includes a second capacitance circuit C2a which is connected in parallel to the above-mentioned serial resonance circuit. The inductor La and the second capacitance circuit C2a constitute a parallel resonance circuit having a parallel resonance frequency. The first capacitance circuit C1a and the second capacitance circuit C2a may be constituted by a variable capacitance circuit having a variable capacitance value.

According to the present embodiment, since the signal having a second frequency can be attenuated, for example, by the parallel resonance frequency of the filter circuit 12 being set to the second frequency, it is possible to obtain an output signal having a first frequency which has an improvement in duty ratio. Therefore, it is possible to realize the signal output circuit 1b capable of improving a duty ratio with a simple configuration.

According to the present embodiment, since the signal having a first frequency can be passed, for example, by the series resonance frequency of the filter circuit 12 being set to the first frequency, it is possible to obtain the output signal having a first frequency which has an improvement in duty ratio. Therefore, it is possible to realize the signal output circuit 1b capable of improving a duty ratio with a simple configuration.

In addition, in the third embodiment, it is also possible to exhibit the same effect as that in the first embodiment and the second embodiment for the same reason.

2. Electronic Device

Figure 7:
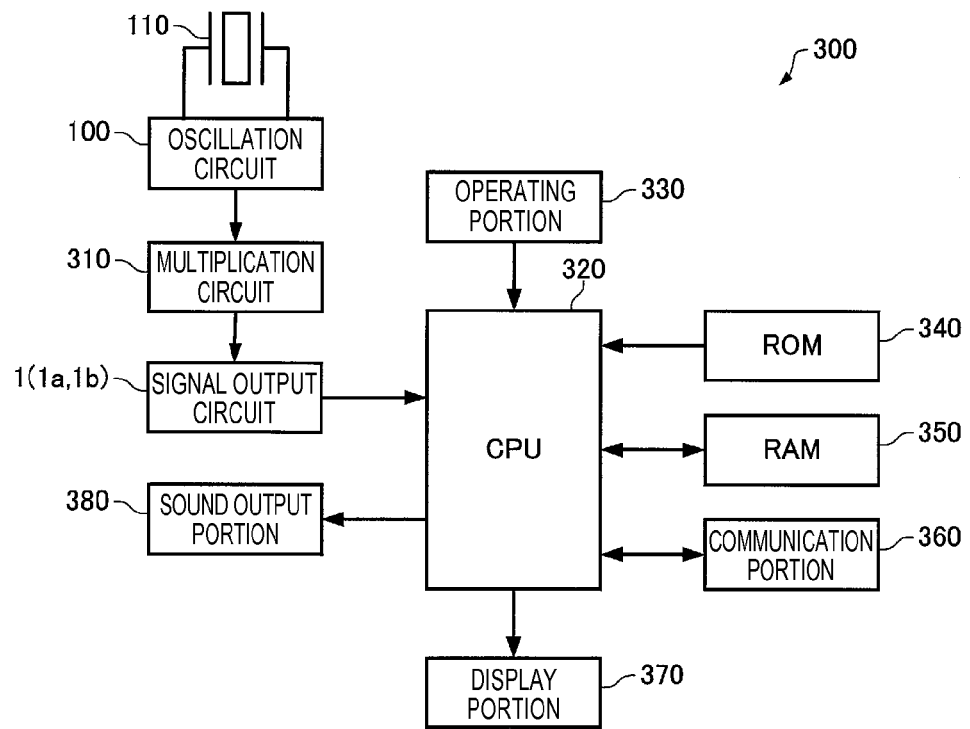
FIG. 7 is a functional block diagram of an electronic device according to the present embodiment.

FIG. 7 is a functional block diagram of an electronic device 300 according to the present embodiment. Meanwhile, the same components as those in each embodiment described above are denoted by the same reference numerals and signs, and thus the detailed description thereof will not be given.

The electronic device 300 according to the present embodiment is the electronic device 300 including the signal output circuit 1, the signal output circuit 1a or the signal output circuit 1b. In the example shown in FIG. 6, the electronic device 300 is configured to include the signal output circuit 1, an oscillation circuit 100, a vibrator 110, a multiplication circuit 310, a CPU (Central Processing Unit) 320, an operating portion 330, a ROM (Read Only Memory) 340, a RAM (Random Access Memory) 350, a communication portion 360, a display portion 370, and a sound output portion 380. Meanwhile, the electronic device 300 according to the present embodiment may have a configuration in which some of the components (respective portions) shown in FIG. 6 are omitted or changed, or other components are added.

The oscillation circuit 100 and the vibrator 110 generate an oscillation signal. The oscillation circuit 100 supplies the oscillation signal to the multiplication circuit 310.

The multiplication circuit 310 supplies a clock signal to the signal output circuit 1. The clock signal may be, for example, a signal obtained by extracting a desired harmonic signal in the multiplication circuit 310 from the oscillation signal from the oscillation circuit 100 which is connected to the vibrator 110, and may be a signal obtained by multiplying the oscillation signal from the oscillation circuit 100 in the multiplication circuit 310 having a PLL synthesizer (not shown). The oscillation signal (clock signal) which is output from the oscillation circuit 100 connected to the vibrator 110 may be supplied to the signal output circuit 1 without going through the multiplication circuit 310 (not shown).

The signal output circuit 1 supplies an output signal to not only the CPU 320 but also the respective portions (not shown).

The CPU 320 performs various types of computation processes and control processes using the output signal of the signal output circuit 1 as a clock pulse, in accordance with a program which is stored in the ROM 340 or the like. Specifically, the CPU 320 performs various types of processes in response to an operation signal from the operating portion 330, a process of controlling the communication portion 360 in order to perform data communication with the outside, a process of transmitting a display signal for causing the display portion 370 to display a variety of information, a process of causing the sound output portion 380 to output various types of sounds, and the like.

The operating portion 330 is an input device constituted by operation keys, button switches or the like, and outputs an operation signal in response to a user's operation to the CPU 320.

The ROM 340 stores a program, data or the like for causing the CPU 320 to perform various types of computation processes and control processes.

The RAM 350 is used as a work area of the CPU 320, and temporarily stores a program and data which are read out from the ROM 340, data which is input from the operating portion 330, arithmetic operation results executed by the CPU 320 in accordance with various types of programs, and the like.

The communication portion 360 performs a variety of controls for establishing data communication between the CPU 320 and an external device.

The display portion 370 is a display device which is constituted by an LCD (Liquid Crystal Display), an electrophoretic display, or the like, and displays a variety of information on the basis of a display signal which is input from the CPU 320.

The sound output portion 380 is a device, such as a speaker, which outputs sound.

According to the electronic device 300 of the present embodiment, since the electronic device includes the signal output circuit 1, the signal output circuit 1a or the signal output circuit 1b which is capable of improving a duty ratio with a simple configuration, it is possible to improve the accuracy of the clock signal with a simple configuration. Therefore, it is possible to realize the electronic device 300 having high reliability using a clock signal with good accuracy, or the electronic device 300 which can operate accurately.

As the electronic device 300, various electronic devices are considered. For example, the electronic device includes a personal computer (for example, mobile-type personal computer, laptop personal computer, or tablet personal computer), a mobile terminal such as a cellular phone, a digital still camera, an ink jet ejecting apparatus (for example, ink jet printer), a storage area network device such as a router or a switch, a local area network device, a device for a mobile terminal and a base station, a television, a video camera, a video recorder, a car navigation device, a pager, a real-time clock device, an electronic notebook (also including a communication function), an electronic dictionary, an electronic calculator, an electronic game console, a game controller, a word processor, a workstation, a TV phone, a security TV monitor, electronic binoculars, a POS (point of sale) terminal, medical instruments (for example, electronic thermometer, sphygmomanometer, blood glucose monitoring system, electrocardiogram measurement device, ultrasound diagnostic device, and electronic endoscope), a fish finder, various types of measuring apparatuses, meters and gauges (for example, meters and gauges of a vehicle, an airplane, and a ship), a flight simulator, a head mounted display, a motion tracer, a motion tracker, a motion controller, a PDR (walker position and direction measurement), an oscillator, and the like.

Figure 8:
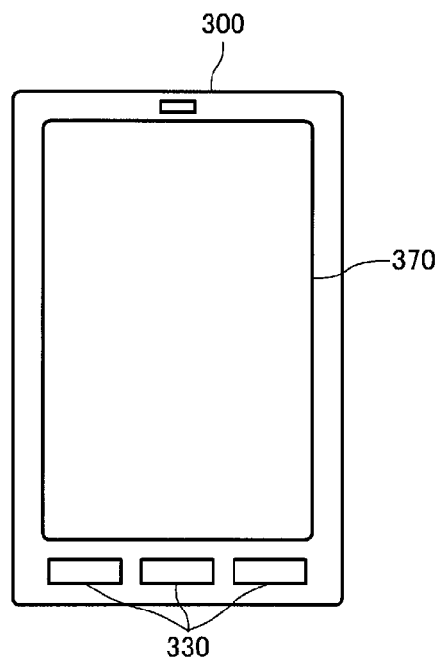
FIG. 8 is a diagram illustrating an example of the appearance of a smartphone which is an example of an electronic device.

FIG. 8 is a diagram illustrating an example of the appearance of a smartphone which is an example of the electronic device 300. The smartphone which is the electronic device 300 includes buttons as the operating portion 330, and includes an LCD as the display portion 370. Since the smartphone which is the electronic device 300 includes the signal output circuit 1, the signal output circuit 1a or the signal output circuit 1b which is capable of improving a duty ratio with a simple configuration, it is possible to improve the accuracy of the clock signal with a simple configuration. Therefore, it is possible to realize the electronic device 300 having high reliability using a clock signal with good accuracy, or the electronic device 300 which can operate accurately.

3. Moving Object

Figure 9:
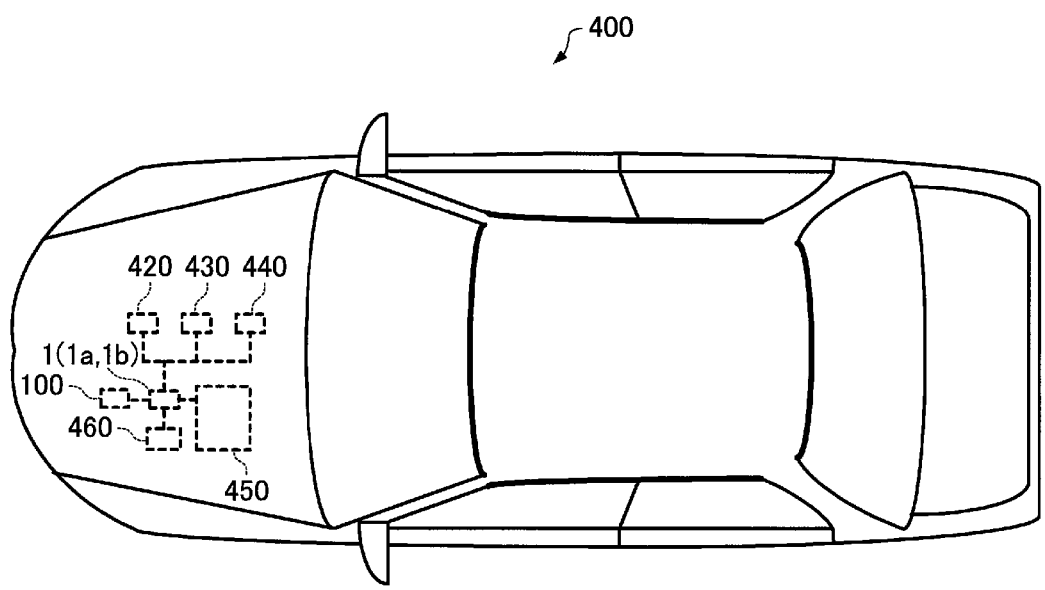
FIG. 9 is a diagram (top view) illustrating an example of a moving object according to the present embodiment.

FIG. 9 is a diagram (top view) illustrating an example of a moving object 400 according to the present embodiment.

Meanwhile, the same components as those in each embodiment described above are denoted by the same reference numerals and signs, and thus the detailed description thereof will not be given.

The moving object 400 according to the present embodiment is the moving object 400 including the signal output circuit 1, the signal output circuit 1a or the signal output circuit 1b. FIG. 9 shows the moving object 400 configured to include the signal output circuit 1 that outputs an output signal to each component on the basis of a clock signal which is output by the oscillation circuit 100. In addition, in an example shown in FIG. 9, the moving object 400 is configured to include a controller 420, a controller 430, and a controller 440 that perform a variety of controls of an engine system, a braking system, a keyless entry system and the like, a battery 450 and a battery 460 for backup. Meanwhile, the moving object 400 according to the present embodiment may have a configuration in which some of the components (respective portions) of FIG. 9 are omitted or changed, and may have a configuration in which other components are added.

According to the moving object 400 of the present embodiment, since the moving object includes the signal output circuit 1, the signal output circuit 1a or the signal output circuit 1b which is capable of improving a duty ratio with a simple configuration, it is possible to improve the accuracy of the clock signal with a simple configuration. Therefore, it is possible to realize the moving object 400 having high reliability using a clock signal with good accuracy, or the moving object 400 which can operate accurately.

Various moving objects may be considered as such a moving object 400. The moving object includes, for example, an automobile (also including an electric automobile), an aircraft such as a jet engine airplane or a helicopter, a ship, a rocket, a satellite, and the like.

As described above, the embodiments or modification examples have been described, but the invention is not limited to these embodiments or modification examples, and can be implemented in various aspects without departing from the scope of the invention.

The invention includes configurations (for example, configurations having the same functions, methods and results, or configurations having the objects and effects) which are substantially the same as the configurations described in the embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2014-149631, filed Jul. 23, 2014 is expressly incorporated by reference herein.

What is claimed is:

1. A signal output circuit comprising:

a signal correction circuit, having a clock signal input thereto, which corrects the clock signal to output the corrected signal; and a waveform shaping circuit that shapes a signal from the signal correction circuit, wherein in the clock signal, pulses having a pulse width $\tau$ capable of being represented by a length of a time are periodically arranged with a period T, and the pulse width $\tau$ and the period T satisfy a relation of $\tau/T \neq 0.5$, and the signal correction circuit attenuates a signal having a second frequency based on a time width of at least one of the pulse width $\tau$ and a pulse width $T-\tau$, rather than a signal having a first frequency based on the period T.

2. The signal output circuit according to claim 1, wherein the signal correction circuit includes a filter circuit that passes the signal having a first frequency and attenuates the signal having a second frequency.

3. The signal output circuit according to claim 1, wherein the signal correction circuit includes a series circuit, connected between a signal line through which the clock signal is transmitted and a reference potential, which has an inductor and a first capacitance circuit connected in series to each other.

4. The signal output circuit according to claim 3, wherein the first capacitance circuit includes a variable capacitive element.

5. The signal output circuit according to claim 3, further comprising a first correction signal generation circuit that generates a first control signal based on at least one of the pulse width $\tau$ and the period T, wherein a capacitance value of the first capacitance circuit is controlled on the basis of the first control signal.

6. The signal output circuit according to claim 3, wherein the signal correction circuit further includes a second capacitance circuit which is connected in parallel to the series circuit.

7. The signal output circuit according to claim 5, wherein the signal correction circuit further includes a second capacitance circuit which is connected in parallel to the series circuit.

8. The signal output circuit according to claim 6, wherein the second capacitance circuit includes a variable capacitive element.

9. The signal output circuit according to claim 7, wherein the second capacitance circuit includes a variable capacitive element.

10. The signal output circuit according to claim 6, further comprising a second correction signal generation circuit that generates a second control signal based on the period T, wherein a capacitance value of the second capacitance circuit is controlled on the basis of the second control signal.

11. The signal output circuit according to claim 7, further comprising a second correction signal generation circuit that generates a second control signal based on the period T, wherein a capacitance value of the second capacitance circuit is controlled on the basis of the second control signal.

12. An electronic device comprising the signal output circuit according to claim 1.

13. A moving object comprising the signal output circuit according to claim 1.

* * * * *